US010353297B2

(12) United States Patent
Ge et al.

(10) Patent No.: US 10,353,297 B2
(45) Date of Patent: Jul. 16, 2019

(54) MOVING PLATFORM DEVICE, EXPOSURE DEVICE AND LITHOGRAPHY MACHINE

(71) Applicant: SHANGHAI MICRO ELECTRONICS EQUIPMENT (GROUP) CO., LTD., Shanghai (CN)

(72) Inventors: Lili Ge, Shanghai (CN); Yuebin Zhu, Shanghai (CN)

(73) Assignee: Shanghai Micro Electronics Equipment (Group) Co., Ltd., Shanghai (CN)

(*) Notice: Subject to any disclaimer, the term of this patent is extended or adjusted under 35 U.S.C. 154(b) by 0 days.

(21) Appl. No.: 16/067,302

(22) PCT Filed: Dec. 28, 2016

(86) PCT No.: PCT/CN2016/112610
§ 371 (c)(1),
(2) Date: Jun. 29, 2018

(87) PCT Pub. No.: WO2017/114410
PCT Pub. Date: Jul. 6, 2017

(65) Prior Publication Data
US 2019/0025712 A1    Jan. 24, 2019

(30) Foreign Application Priority Data
Dec. 31, 2015    (CN) .......................... 2015 1 1031819

(51) Int. Cl.
*G03F 7/20*    (2006.01)
*H01L 21/677*    (2006.01)

(52) U.S. Cl.
CPC ............ *G03F 7/70358* (2013.01); *G03F 7/20* (2013.01); *G03F 7/70716* (2013.01);
(Continued)

(58) Field of Classification Search
CPC ............ G03F 7/70716; G03F 7/70841; G03F 7/70733; G03F 7/70358
(Continued)

(56) References Cited

U.S. PATENT DOCUMENTS

2008/0143994 A1*  6/2008  Shibazaki ........... G03F 7/70725
355/72

FOREIGN PATENT DOCUMENTS

CN        1701925 A      11/2005
CN      101840879 A       9/2010
(Continued)

*Primary Examiner* — Hung Nguyen
(74) *Attorney, Agent, or Firm* — Muncy, Geissler, Olds & Lowe, P.C.

(57) ABSTRACT

A motion stage device, an exposure device and a lithography machine are disclosed. The motion stage device includes: Y-direction motors (203), a mover of each Y-direction motor (203) movable in a horizontal Y-direction; X-direction motors provided on X-direction guide rails (105), the X-direction guide rails (105) is in connection with the movers of the Y-direction motors (203) and movable in the horizontal Y-direction under actuation of the Y-direction motors (203), the X-direction motors having movers (107b) movable in a horizontal X-direction; an inner frame (102), supporting the X-direction guide rails (105); and a motion stage (108, 106), disposed on the movers (107b) of the X-direction motor. This motion stage device possesses improved modal and vibration characteristics because of a reduced load on the Y-direction motors (203). Additionally, the X-direction guide rails (105) are in non-contact connection with the inner frame (102) and thus will not pose significant vibration-causing impacts on the inner frame (102). This allows stable movement and improved control accuracy.

18 Claims, 3 Drawing Sheets

(52) U.S. Cl.
CPC ...... *G03F 7/70725* (2013.01); *G03F 7/70758* (2013.01); *G03F 7/70766* (2013.01); *H01L 21/67706* (2013.01)

(58) Field of Classification Search
USPC ..................................................... 355/72–76
See application file for complete search history.

(56) References Cited

FOREIGN PATENT DOCUMENTS

| | | |
|---|---|---|
| CN | 103226295 A | 7/2013 |
| CN | 103472681 A | 12/2013 |
| CN | 104678711 A | 6/2015 |
| JP | 2002093686 A | 3/2002 |

\* cited by examiner

MOVING PLATFORM DEVICE, EXPOSURE DEVICE AND LITHOGRAPHY MACHINE

TECHNICAL FIELD

The present invention relates to a motion stage device, an exposure device and a photolithography machine for use in the fabrication of semiconductor integrated circuits (ICs).

BACKGROUND

Photolithography is a process to transfer a pattern from a photomask to a substrate by means of exposure. During this process, the substrate is supported on a workpiece stage, and an exposure device incorporated in a photolithography machine projects an image of the photomask pattern onto the surface of the substrate. Photolithography process performed by the photolithography machine is critical to the fabrication of semiconductor devices. In the photolithography machine, the workpiece stage is operative to move under a projection objective while carrying the substrate or wafer in coordination with a mask stage so that the substrate or wafer is exposed by light from the projection objective as desired. Therefore, control accuracy of the workpiece stage directly determines how well the photolithography process can be performed, so it is necessary for the workpiece stage to have good control accuracy. When the workpiece stage is moving, it will exert a reaction force directly on an inner frame of the photolithography machine. This shock may lead to augmented vibration of the inner frame and various components carried thereby, which can harm or even disable the exposure process.

FIG. 1 shows a conventional exposure device including an illumination system 11, a mask stage 12, a projection optical system 13 and a workpiece stage 20. The workpiece stage 20 includes two Y-direction motors that are disposed in parallel on an outer frame. An intermediate guide rail 21 connects, at its two ends, movers of the Y-direction motors so that it is perpendicular to both of the Y-direction motors and forms an H-shaped assembly therewith. Actuated by the Y-direction motors, the workpiece stage 20 can travel a long distance in the Y direction. An X-direction motor 22 is disposed on the intermediate guide rail 21. The X-direction motor 22 has a mover supporting a mounting plate 34 on which a coarse-motion stage 24 is arranged. The coarse-motion stage 24 is slidably connected to the intermediate guide rail 21 via an X-slider 23. The X-direction motor 22 is operable to drive the coarse-motion stage 24 to move in the X direction. A fine-motion stage 25 is provided above the coarse-motion stage 24 in a non-contact manner. The fine-motion stage 25 is finely tunable by a plurality of voice coil motors 33 which are disposed between the coarse-motion stage 24 and the fine-motion stage 25. Under the fine-motion stage 25, reinforcing members 26 are attached to opposing edges thereof, and air bearings 27 are provided under the respective reinforcing members 26. Correspondingly, there are two step guides 28 on the two sides of the intermediate guide rail 21, which are spaced apart from each other by the same distance. The step guides 28 provide surfaces on which the air bearings 27 can create air films for supporting the fine-motion stage 25 at the opposing edges. The step guides 28 are in mechanical connection with the intermediate guide rail 21 via connecting mechanism 29 and in slidable connection with the inner frame 31 via a Y-slider 30. A substrate holder 32 is attached to the fine-motion stage 25, and the substrate P is retained on the substrate holder 32.

As the intermediate guide rail 21 is disposed on the Y-direction motors in this conventional device, the Y-direction motors have to directly bear the significant load imposed by all the components on the intermediate guide rail 21 as well as by the step guides 28. As a result, the workpiece stage exhibits poor modal and vibration characteristics. In addition, the step guides 28 in slidable connection with the inner frame 31 via the slider may pose vibration-causing impacts on the inner frame 31, and friction that may occur in the slidable connection can affect the control accuracy.

SUMMARY OF THE INVENTION

The technical problem of the present invention to be solved is to provide a motion stage device, an exposure device and a photolithography machine with a lower load on motors, a reduced internal impact, improved modal characteristics and higher control accuracy.

To this end, the subject matter of the present invention lies in a motion stage device, including:

Y-direction motors, including movers movable in a horizontal Y-direction;

X-direction motors provided on X-direction guide rails, the X-direction guide rails being in connection with the movers of the Y-direction motors and movable in the horizontal Y-direction under actuation of the Y-direction motors, the X-direction motors having movers movable in a horizontal X-direction;

an inner frame, configured to support the X-direction guide rails; and a motion stage, disposed on the movers of the X-direction motor.

Preferably, a number of the Y-direction motors is two and the Y-direction motors are disposed on the outer frame.

Preferably, a number of the Y-direction motors is two and the Y-direction motors are disposed on the inner frame.

Preferably, the stators of the Y-direction motor are connected to the outer frame by reaction force containing members.

Preferably, each of the reaction force containing members includes a damping element and/or a spring element.

Preferably, Y-direction intermediate guide rails are provided on the inner frame, wherein air suspension assemblies are provided on bottom surfaces of the X-direction guide rails, and wherein the Y-direction intermediate guide rails provide suspension surfaces for the air suspension assemblies.

Preferably, a number of the Y-direction intermediate guide rails is greater than one.

Preferably, the X-direction guide rails are connected to the movers of the Y-direction motors by connectors each implemented as a flexible part that is less stiff in a Z-direction than in the X- and Y-directions.

Preferably, a number of the X-direction guide rails is equal to or greater than one.

Preferably, a number of the X-direction guide rails is two and the X-direction guide rails are interconnected by connecting mechanism.

Preferably, a number of the X-direction motors is two, wherein the movers of the X-direction motors are both disposed on the motion stage, and wherein each of X-direction motors further has a stator disposed on a corresponding one of the X-direction guide rails.

Preferably, the motion stage includes an X-direction slider and a fine-motion plate, wherein the movers of the X-direction motors are disposed on the X-direction slider, and wherein X-direction fine-motion motors and Y-direction fine-motion motors are provided between the fine-motion plate and the X-direction slider.

Preferably, opposing end portions of the X-direction slider define inverted U-shaped channels, each covering a corresponding one of the X-direction guide rails from a top surface and two lateral sides, wherein the stators of the X-direction motors are disposed on inner lateral sides of the X-direction guide rails, and wherein the movers of the X-direction motors are disposed on inner walls of the inverted U-shaped channels.

Preferably, air suspension assemblies for supporting the X-direction slider are provided on inner walls of the channels that face the top surface and outer lateral sides of the X-direction guide rails.

Preferably, a number of the X-direction fine-motion motors is two and a number of the Y-direction fine-motion motors is two, and the X-direction fine-motion motors and the Y-direction fine-motion motors are disposed in symmetry in the X- and Y-directions, respectively.

Preferably, the X-direction slider defines a trough having four inner walls on which stators of the X-direction fine-motion motors or stators of the Y-direction fine-motion motors are disposed, wherein protrusions projecting from a bottom surface of the fine-motion plate extend into the trough, and wherein movers of the X-direction fine-motion motors or movers of the Y-direction fine-motion motors are disposed on the protrusions.

Preferably, air suspension assemblies are provided on a bottom surface of the fine-motion plate, wherein the X-direction slider provides suspension surfaces for the air suspension assemblies.

Preferably, a substrate holder on which a substrate is held is fixedly attached to a top surface of the fine-motion plate.

Preferably, the inner frame is configured to support the X-direction guide rails without contact therewith.

An exposure device includes the motion stage device as defined above.

A photolithography machine includes the exposure device as defined above.

Compared to the conventional device, the present invention is optimized by using the X-direction guide rails that are supported by the inner frame without contact therewith in lieu of the conventional intermediate guide rail supported by the Y-direction motors and the two step guides in connection with the intermediate guide rail. As a result, the overall weight of the components carried by the Y-direction motors is reduced, and an improvement is achieved in modal and vibration characteristics of the motion stage device. Moreover, the X-direction guide rails in contactless connection with the inner frame will not pose significant vibration-causing impacts thereon, allowing stable movement and improved control accuracy.

BRIEF DESCRIPTION OF THE DRAWINGS

In FIG. 1: 11—illumination system; 12—mask stage; 13—projection optical system; 20—workpiece stage; 21—intermediate guide rail; 22—X—direction motor; 23—X—slider; 24—coarse-motion stage; 25—fine-motion stage; 26—reinforcing member; 27—air bearing; 28—step guide; 29—connecting mechanism; 30—Y—slider; 31—inner frame; 32—substrate holder; 33—voice coil motor; 34—mounting plate; P—substrate.

In FIGS. 2-3: 101—shock absorbers; 102—inner frame; 103—Y—direction intermediate guide rail; 104—air suspension assembly; 105—X—direction guide rail; 106—fine-motion plate; 107a—stator of an X—direction motor; 107b—mover of the X—direction motor; 108—X—direction slider; 109—substrate holder; 110a—stator of an X—direction fine-motion motor; 110b—mover of the X—direction fine-motion motor; 201—outer frame; 202—Y—direction guide rail; 203—Y—direction motor; 204—Y—direction rail bracket; 205—Y—direction slider; 206—connecting mechanism; 207—connector; 208a—stator of a Y—direction fine-motion motor; 208b—mover of the Y—direction fine-motion motor; 301—mirror mount; 302—elongated mirror.

In FIGS. 4-5: 401—inner frame; 402—Y—direction rail bracket; 403—Y—direction slider; 404—X—direction guide rail; 405—connector; 406—Y—direction intermediate guide rail; 407a—stator of a Y—direction motor; 407b—mover of the Y—direction motor; 408—Y—direction guide rail; 409—connecting mechanism; 501—shock absorber; 502—damping element; 503—Y—direction sliding element; 504—spring element; 505—outer frame.

DETAILED DESCRIPTION OF EMBODIMENTS

The present invention will be described in detail with reference to the accompanying drawings.

Embodiment 1

Figure 1:
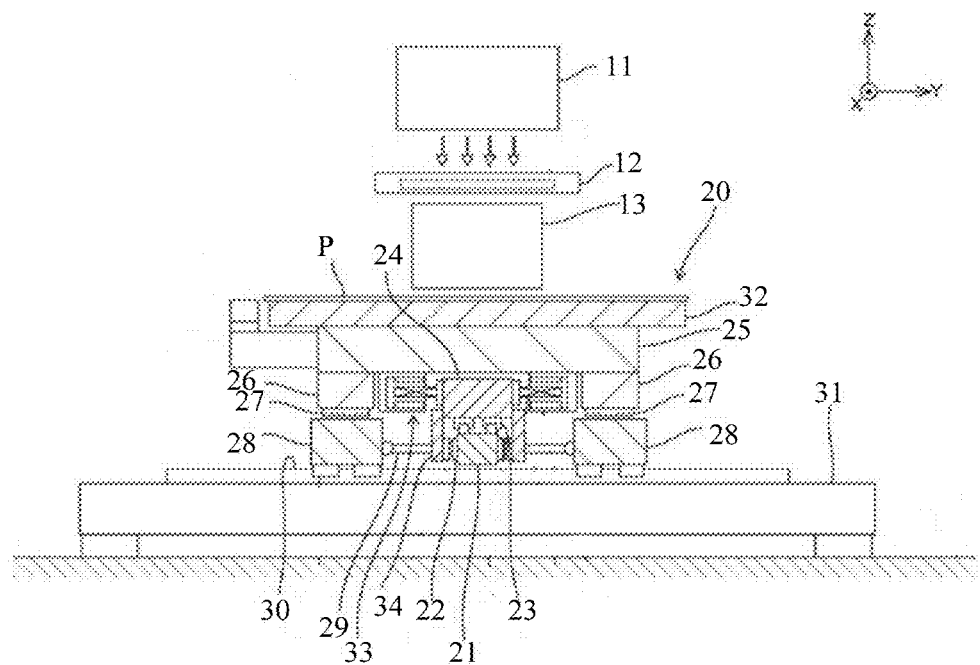
FIG. 1 is a structural schematic of a conventional exposure device.
Figure 2:
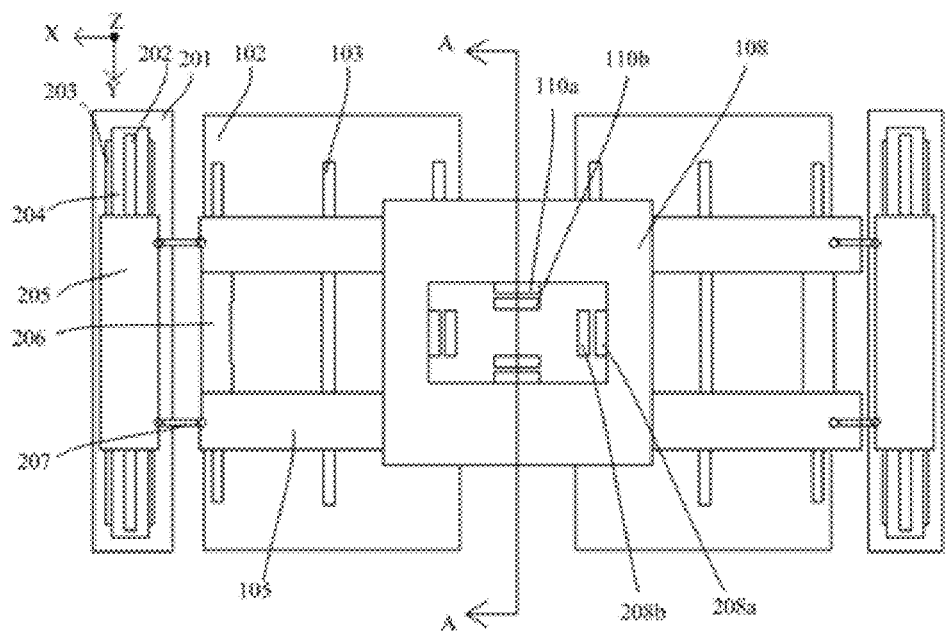
FIG. 2 is a structural schematic of a motion stage device according to an embodiment of the present invention.
Figure 3:
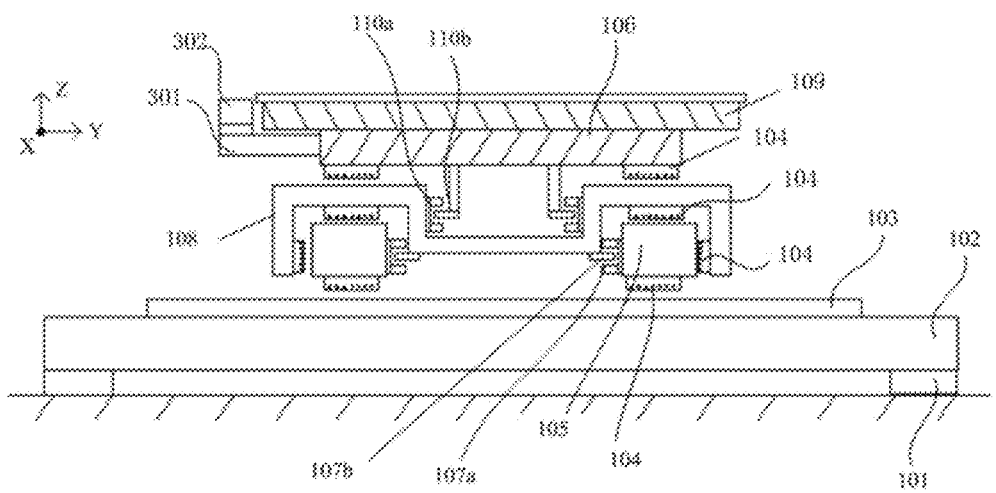
FIG. 3 is a cross-sectional view of the motion stage device of FIG. 2 along the line A-A.

FIGS. 2 and 3 show a motion stage device in an exposure device according to one embodiment of the present invention. The exposure device additionally includes an illumination system, a mask stage system, a projection optical system, an interferometer-based measurement system and control systems respectively for the above components. Herein, a direction of movement of a photomask on the mask stage system relative to a substrate on the motion stage device is defined as the horizontal Y-direction (i.e., the stepping direction), and a scanning direction during exposure of the substrate on the motion stage device is defined as the horizontal X-direction.

The motion stage device includes an outer frame 201, an inner frame 103, Y-direction motors 203, X-direction guide rails 105, X-direction motors, an X-direction slider 108 and a fine-motion plate 106.

The Y-direction motors 203 are disposed on the outer frame 201, and the number of the motors is two. Specifically, Y-direction rail brackets 204 are mounted on the outer frame 201, and Y-direction guide rails 202 are fixed to the Y-direction rail brackets 204. The Y-direction sliders 205 are slidable along the respective Y-direction guide rails 202. The Y-direction motors 203 have movers attached to the respective Y-direction sliders 205 and stators fixed to the outer frame 201. The Y-direction motors 203 are operative to drive the Y-direction sliders 205 to move in the horizontal Y-direction.

With continued reference to FIGS. 2 to 3, the X-direction guide rails 105 are connected to the Y-direction sliders 205 by a connector 207. The X-direction guide rails 105 can be floatingly supported, with the aid of air suspension assemblies 104 attached to bottom surfaces thereof, on Y-direction intermediate guide rails 103. The Y-direction intermediate guide rails 103 are fixed to the inner frame 102. The inner frame 102 is supported on the ground by shock absorbers 101. Preferably, in order to reduce disturbances transferred from the outer frame 201 to the X-direction guide rails 105 via the Y-direction sliders 205, the connector 207 may be implemented as flexible parts that are less stiff in the Z-direction than in the X- and Y-directions. The number of the Y-direction intermediate guide rails 103 may be one, two or more, and the number of the X-direction guide rails 105 may also be one, two or more. In this embodiment, the number of the X-direction guide rails 105 is two, and the two X-direction guide rails 105 are interconnected by a connecting mechanism 206. When suspended, the X-direction guide rails 105 may translate in the horizontal Y-direction under actuation of the Y-direction sliders 205 without contact with any other component and thus with minimized friction therewith during the movement in the horizontal Y-direction. The X-direction motors are provided on the X-direction guide rails 105, and the number of the motors may also be two. Specifically, with one of the X-direction guide rails 105 explained as an example, a corresponding one of the X-direction motors has a stator 107a fixed at an inner lateral side of the X-direction guide rail 105 and a mover 107b disposed on the X-direction slider 108.

Further, opposing end portions of the X-direction slider 108 define inverted U-shaped channels, each covering a corresponding one of the X-direction guide rails 105 from the top and two sides. The movers 107b of the X-direction motors are disposed on inner walls of the channels that face the inner lateral sides of the X-direction guide rails 105. Air suspension assemblies 104 are disposed on inner walls of the channels that face the top and outer lateral sides of the X-direction guide rails 105. The air suspension assemblies 104 are provided to support the X-direction slider 108. The X-direction slider 108 can travel in the horizontal X-direction with minimized friction under actuation of the X-direction motors.

Between the X-direction slider 108 and the fine-motion plate 106 are provided X-direction fine-motion motors and Y-direction fine-motion motors. The fine-motion plate 106 is capable of long-strike movement in the X- and Y-directions under actuation of the X-direction slider 108 and is capable of short-strike movement relative to the X-direction slider 108 in the X- and Y-directions under actuation of the X-direction fine-motion motors and Y-direction fine-motion motors.

Specifically, the number of the X-direction fine-motion motors is two, and the number of the Y-direction fine-motion motors is also two. The X-direction slider 108 defines a trough having two inner walls extending in the X-direction on which stators 110a of the X-direction fine-motion motors are disposed. The trough has additional two inner walls extending in the Y-direction on which stators 208a of the Y-direction fine-motion motors are disposed. Protrusions projecting from a bottom surface of the fine-motion plate 106 extend into the trough, and movers 110b of the X-direction fine-motion motors or movers 208b of the Y-direction fine-motion motors are disposed on the protrusions. On the bottom surface of the fine-motion plate 106 are further provided air suspension assemblies 104. The air suspension assemblies 104 can interact with surface portions of the X-direction slider 108 that they directly face, to allow suspension of the fine-motion plate 106 and hence minimized friction in the short-strike movement thereof.

A substrate holder 109 is fixedly attached to a top surface of the fine-motion plate 106. The substrate is held on the substrate holder 109. On a side face of the fine-motion plate 106 is disposed a mirror mount 301 and an elongated mirror 302 which can assist a measurement along a measuring axis of an interferometer. The substrate holder 109, the mirror mount 301 and the elongated mirror 302 move along with the fine-motion plate 106, and the X-direction fine-motion motors and the Y-direction fine-motion motors on the fine-motion plate 106 operate directly based on measurements of the interferometer that is provided on the inner frame 102. In this way, external disturbances in the X- and Y-direction can hardly affect servo accuracy of the motion stage device.

Compared to the conventional device, the present invention is optimized by using the X-direction guide rails 105 that are supported by the inner frame 102 without contact therewith instead of the conventional intermediate guide rail supported by the Y-direction motors and the conventional two step guides in connection with the intermediate guide rail. As a result, the overall weight of the components carried by the Y-direction motors 203 is reduced. With the same materials of the components and the same joint stiffness therebetween, as can be seen from a deviation of the kinetic differential equation for the system, i.e., $\omega=\sqrt{k/m}$, where co represents an angular frequency, k denotes a coefficient and m is the mass of the system, the reduced overall weight will lead to an improvement in modal characteristics of the system. Therefore, the motion stage device of the present invention possesses improved modal and vibration characteristics. Moreover, the X-direction guide rails 105 in connection with the inner frame 102 in a non-contact manner will not pose significant vibration-causing impacts thereon, allowing stable movement and improved control accuracy.

Embodiment 2

Figure 4:
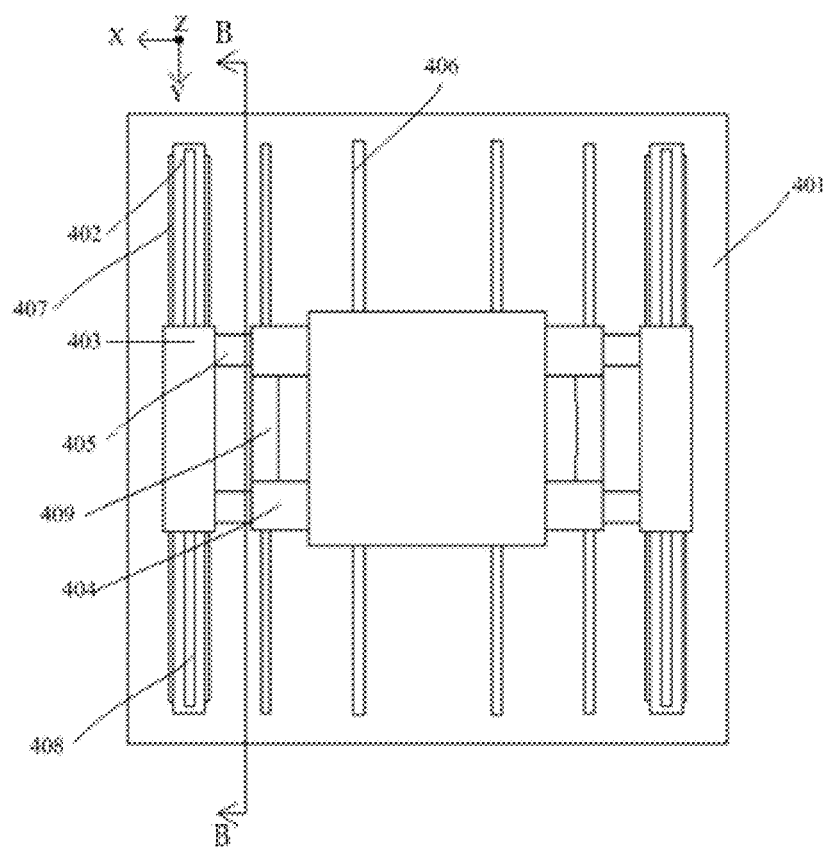
FIG. 4 is a structural schematic of a motion stage device according to an embodiment of the present invention.
Figure 5:
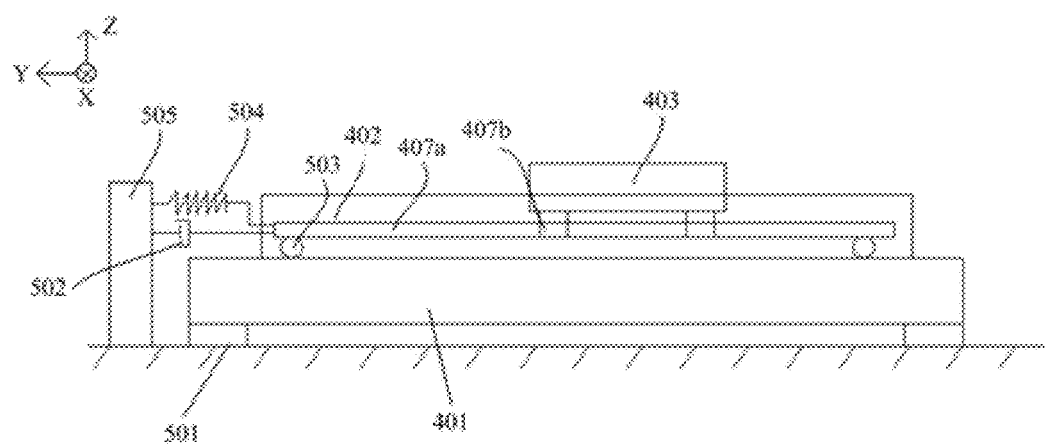
FIG. 5 is a cross-sectional view of the motion stage device of FIG. 4 along the line B-B.

FIGS. 4 and 5 show a motion stage device according to another embodiment of the present invention, wherein a stepping direction of a substrate on the motion stage device is defined as the horizontal Y-direction and a scanning direction during exposure of the substrate on the motion stage device is defined as the horizontal Y-direction.

The motion stage device includes two Y-direction motors disposed on an inner frame 401. Specifically, Y-direction rail brackets 402 are mounted on the inner frame 401, and Y-direction guide rails 408 are fixed to the Y-direction rail brackets 402. The Y-direction sliders 403 are slidable along the respective Y-direction guide rails 408. The Y-direction motors have movers 407b attached to respective Y-direction sliders 403 and stators 407a fixed to the inner frame 401. The Y-direction motors are operative to drive the Y-direction sliders 403 to move in the horizontal Y-direction.

X-direction guide rails 404 are connected to the Y-direction sliders 403 by a connector 405. The X-direction guide rails 105 can be floatingly supported, with the aid of air suspension assemblies attached to bottom surfaces thereof, on Y-direction intermediate guide rails 406 fixed to the inner frame 401. In this embodiment, the number of the X-direction guide rails 404 is two, and the two X-direction guide rails 404 are interconnected by a connecting mechanism 409. When suspended, the X-direction guide rails 404 may translate in the horizontal Y-direction under actuation of the Y-direction sliders 403 without contact with any other component and thus with minimized friction therewith.

With particular reference to FIG. 5, stators 407a of the Y-direction motors are connected to an outer frame 505 via reaction force containing members, each reaction force containing member including, in particular, a damping element 502 and a spring element 504. That is, the stators 407a of the Y-direction motors are connected to the outer frame 505 via the damping elements 502 and the spring elements 504. In addition, the stators 407a are further in connection with the inner frame 401 via Y-direction sliding elements 503. In this way, any impact from the Y-direction motors can be attenuated for the inner frame 401 and all the components in connection with the inner frame 401.

The present invention also provides a photolithography machine incorporating the exposure device as defined above. The exposure device is adapted for exposure of a substrate in a photolithography process.

What is claimed is:

1. A motion stage device, comprising:
   Y-direction motors, comprising movers movable in a horizontal Y-direction;
   X-direction motors provided on X-direction guide rails, the X-direction guide rails being in connection with the movers of the Y-direction motors and movable in the horizontal Y-direction under actuation of the Y-direction motors, the X-direction motors having movers movable in a horizontal X-direction;
   an inner frame, configured to support the X-direction guide rails; and
   a motion stage, disposed on the movers of the X-direction motors,
   wherein a number of the X-direction guide rails is two and the X-direction guide rails are interconnected by a connecting mechanism, a number of the X-direction motors is two, the movers of the X-direction motors are both disposed on the motion stage, and each of the X-direction motors further has a stator disposed on a corresponding one of the X-direction guide rails, the motion stage comprises an X-direction slider and a fine-motion plate, the movers of the X-direction motors are disposed on the X-direction slider, and X-direction fine-motion motors and Y-direction fine-motion motors are provided between the fine-motion plate and the X-direction slider.

2. The motion stage device of claim 1, wherein a number of the Y-direction motors is two and the Y-direction motors are disposed on an outer frame.

3. The motion stage device of claim 1, wherein a number of the Y-direction motors is two and the Y-direction motors are disposed on the inner frame.

4. The motion stage device of claim 3, wherein the Y-direction motors comprise stators connected to an outer frame by reaction force containing members.

5. The motion stage device of claim 4, wherein each of the reaction force containing members comprises a damping element and/or a spring element.

6. The motion stage device of claim 1, wherein Y-direction intermediate guide rails are provided on the inner frame, wherein air suspension assemblies are provided on bottom surfaces of the X-direction guide rails, and wherein the Y-direction intermediate guide rails provide suspension surfaces for the air suspension assemblies.

7. The motion stage device of claim 6, wherein a number of the Y-direction intermediate guide rails is greater than one.

8. The motion stage device of claim 1, wherein the X-direction guide rails are connected to the movers of the Y-direction motors by connectors each implemented as a flexible part that is less stiff in a Z-direction than in the X- and Y-directions.

9. The motion stage device of claim 1, wherein a number of the X-direction guide rails is equal to or greater than one.

10. The motion stage device of claim 1, wherein opposing end portions of the X-direction slider define inverted U-shaped channels, each covering a corresponding one of the X-direction guide rails from a top surface and two lateral sides, wherein the stators of the X-direction motors are disposed on inner lateral sides of the X-direction guide rails, and wherein the movers of the X-direction motors are disposed on inner walls of the inverted U-shaped channels.

11. The motion stage device of claim 10, wherein air suspension assemblies for supporting the X-direction slider are provided on the inner walls of the inverted U-shaped channels that face the top surface and outer lateral sides of the X-direction guide rails.

12. The motion stage device of claim 1, wherein a number of the X-direction fine-motion motors is two and a number of the Y-direction fine-motion motors is two, and wherein the X-direction fine-motion motors and the Y-direction fine-motion motors are disposed in symmetry in the X- and Y-directions, respectively.

13. The motion stage device of claim 12, wherein the X-direction slider defines a trough having four inner walls on which stators of the X-direction fine-motion motors or stators of the Y-direction fine-motion motors are disposed, wherein protrusions projecting from a bottom surface of the fine-motion plate extend into the trough, and wherein movers of the X-direction fine-motion motors or movers of the Y-direction fine-motion motors are disposed on the protrusions.

14. The motion stage device of claim 1, wherein air suspension assemblies are provided on a bottom surface of the fine-motion plate, and wherein the X-direction slider provides suspension surfaces for the air suspension assemblies.

15. The motion stage device of claim 1, wherein a substrate holder on which a substrate is held is fixedly attached to a top surface of the fine-motion plate.

16. The motion stage device of claim 1, wherein the inner frame is configured to support the X-direction guide rails in a non-contact manner.

17. An exposure device, comprising the motion stage device as defined in claim 1.

18. A photolithography tool, comprising the exposure device as defined in claim 17.

* * * * *